United States Patent
Ross et al.

[19]

[11] Patent Number: 6,143,375
[45] Date of Patent: *Nov. 7, 2000

[54] METHOD FOR PREPARING A SUBSTRATE FOR A MAGNETIC DISK

[75] Inventors: Caroline A. Ross, Mountain View; Martin Philip Rosenblum, Menlo Park, both of Calif.

[73] Assignee: Komag, Incorporated, San Jose, Calif.

[*] Notice: This patent is subject to a terminal disclaimer.

[21] Appl. No.: 09/239,459

[22] Filed: Jan. 28, 1999

[51] Int. Cl.$^7$ ...................................................... B05D 3/00
[52] U.S. Cl. ...................... 427/555; 427/130; 427/131; 427/132; 427/258; 427/264; 427/266; 427/269; 427/270; 427/271; 427/287; 427/294; 427/355; 427/372.2; 427/383.1; 427/404; 427/419.7; 427/443.2; 427/596; 428/65.3; 428/65.5; 428/65.6; 428/65.7; 428/694 T; 428/694 TR
[58] Field of Search ..................................... 427/555, 130, 427/131, 132, 264, 266, 269, 270, 271, 287, 294, 383.1, 404, 258, 355, 372.2, 419.7, 443.2, 596; 428/65.3, 65.5, 65.6, 65.7, 694 T, 694 TR

[56] References Cited

U.S. PATENT DOCUMENTS

| | | | |
|---|---|---|---|
| 4,786,564 | 11/1988 | Chen et al. | 428/694 |
| 4,794,047 | 12/1988 | Funamoto | 428/408 |
| 4,833,001 | 5/1989 | Kijima et al. | 428/141 |
| 4,863,810 | 9/1989 | Bhattacharya et al. | 428/661 |
| 4,990,361 | 2/1991 | Kibe et al. | 427/38 |
| 5,037,515 | 8/1991 | Tsai et al. | 204/192.15 |
| 5,062,021 | 10/1991 | Ranjan et al. | 360/135 |
| 5,084,152 | 1/1992 | Lin | 204/192.15 |
| 5,087,481 | 2/1992 | Chen et al. | 427/129 |
| 5,108,781 | 4/1992 | Ranjan et al. | 427/53.1 |
| 5,153,044 | 10/1992 | Chen et al. | 428/64 |
| 5,180,640 | 1/1993 | Yamashita et al. | 428/611 |
| 5,250,339 | 10/1993 | Tani et al. | 428/64 |
| 5,314,745 | 5/1994 | Okumura | 428/336 |
| 5,741,560 | 4/1998 | Ross . | |
| 5,980,997 | 11/1999 | Ross . | |

FOREIGN PATENT DOCUMENTS

| | | |
|---|---|---|
| 0 652 554 A1 | 5/1995 | European Pat. Off. . |
| 7-182655 | 7/1995 | Japan . |

OTHER PUBLICATIONS

Lowenheim, "Modern Electroplating", pp. 593–595 and pp. 710–715, John Wiley & Sons, 1974. (No Month Avail.).

Perettie, D., "Alternative Substrates: The Critical Issues", Insight, vol. VIII, No. 6, Nov./Dec. 1995.

Teng, E., et al., "Laser Zone Texture on Alternative Substrate Disks", Intermag conference, IEEE 1996. (No Month Avail.).

Dialog Printout, pp. 1–157, May 17, 1997.

Baumgart, P. et al., "A New Laser Texturing Technique for High Performance Magnetic Disk Drives", IEEE Transactions on Magnetics, vol. 31, No. 6, Nov. 1995.

Baumgart, et al., "Safe Landings: Laser Texturing of High–Density Magnetic Disks", Data Storage, pp. 21–24, Mar. 1996.

Krajnovich, D. et al., "Experimental and Theoretical Studies of Bump Formation During Laser Texturing of Ni–P" IEEE 1996. (No Month Avail.).

*Primary Examiner*—Bernard Pianalto
*Attorney, Agent, or Firm*—Skjerven Morrill MacPherson LLP; David E. Steuber

[57] ABSTRACT

A method for manufacturing a magnetic disk comprises the step of depositing a metallic layer on a glass substrate and laser texturing the metallic layer. The magnetic disk is then completed by deposition of (a) an underlayer such as Cr or sputtered NiP, (b) a magnetic layer such as a Co or Fe alloy, and (c) a protective overcoat such as $ZrO_2$, carbon or hydrogenated carbon. By providing the above-mentioned metallic layer, laser texturing can now be used in conjunction with glass substrates.

24 Claims, 9 Drawing Sheets

METHOD FOR PREPARING A SUBSTRATE FOR A MAGNETIC DISK

BACKGROUND OF THE INVENTION

This invention relates to substrates for magnetic disks, and methods for coating and texturing (i.e. roughening) such substrates.

It is known in the art to use glass substrates for magnetic disks because glass is suitably impact resistant. In other words, a glass substrate will not be deformed if a read-write head strikes the disk. However, because glass is hard and brittle, it is difficult to mechanically texture glass substrates, and instead, they are typically textured with an HF chemical etching process prior to being covered with an underlayer and a magnetic film. See, for example, U.S. Pat. No. 5,087,481, issued to Chen, et al. and U.S. Pat. No. 4,833,001, issued to Kijima, et al., each of which is incorporated herein by reference. (The reason that magnetic disk substrates are textured is to reduce stiction between the magnetic disk and a read-write head during use.) Unfortunately, even chemical texturing of glass substrates is difficult and expensive, and it is particularly difficult to obtain consistent results with chemical texturing.

It is also known in the art to use aluminum substrates covered with plated NiP to manufacture magnetic disks. Of importance, aluminum is a light weight material and NiP can be polished and mechanically textured. Further, the NiP is hard and prevents the aluminum substrate from becoming dented if the read-write head strikes the disk. (In contrast, it is unnecessary to cover glass substrates with plated NiP because glass is more impact resistant than NiP, and to the best of the present inventor's knowledge, NiP is not plated onto glass substrates in the manufacture of magnetic disks.) Also of importance, NiP lends itself to being mechanically textured.

NiP-coated aluminum substrates are typically prepared by subjecting an aluminum substrate to a zincate process, during which it is immersed in an alkaline zinc immersion bath. Such a process is described at pages 593 to 595 of "Modern Electroplating", edited by Lowenheim, published by John Wiley & Sons, Inc. in 1974, incorporated herein by reference. The zincate process results in formation of a thin Zn layer on the aluminum substrate. The substrate is then plated with NiP by electroless plating. See, for example, F. Pearlstein, "Electroless Plating", published at pages 710 to 725 of "Modern Electroplating", also incorporated herein by reference. During this process, the Zn layer is consumed and replaced by a NiP layer. The NiP layer is then polished and mechanically textured.

In recent years, industry has started experimenting with laser texturing. During laser texturing, a laser beam is used to form craters in the NiP layer. See, for example, U.S. Pat. No. 5,062,021 and 5,108,781, each issued to Ranjan et al., incorporated herein by reference. Also see Baumgart, et al., "Safe Landings: Laser Texturing of High-Density Magnetic Disks", Data Storage, March 1996, also incorporated herein by reference. When using this process, the substrate must be smooth prior to laser texturing.

One advantage of laser texturing is that it can be used to texture a small portion of the disk surface to form a "take-off and landing zone" (also called a "contact-start-stop zone" or "CSS zone") where the read-write head takes off and lands when the disk drive is turned on and off. The remainder of the disk (the "data zone") is used to store data. In contrast, it is difficult to limit texturing to a take-off and landing zone with the above-described HF chemical etching process.

It has previously been difficult to use a laser to texture a magnetic disk with a glass substrate because laser light is not readily absorbed by a glass substrate. One has to use a relatively powerful laser to texture glass. See, for example, Teng, et al., "Laser Zone Texture on Alternative Substrate Disks", published at the 1996 Intermag Conference, incorporated herein by reference. It would be desirable to be able to laser texture a glass substrate instead of the above-mentioned chemical etching techniques.

SUMMARY

A method in accordance with my invention comprises the step of depositing a smooth metallic layer on a glass substrate and texturing the metallic layer with a laser beam. The metallic layer is preferably impact resistant, hard and has a high melting temperature (e.g., greater than 1000° C.).

In a first embodiment, a metallic initiation layer is deposited on the glass substrate followed by electroless plating of NiP onto the initiation layer. The initiation layer is a material which facilitates electroless plating of NiP, such as Zn, Pd, Co, Fe, Rh, Be, NiP, Ni or alloys thereof. The initiation layer is formed because it is not possible to electroless plate NiP directly onto glass. After electroless plating, the NiP layer is then polished and laser textured.

During one process in accordance with the first embodiment, the initiation layer is a thin Zn layer, and is formed by a zincate process. During this process, Al is deposited on the glass substrate, e.g. by sputtering, evaporation or other method. Thereafter, the substrate is subjected to the zincate process to form the Zn layer on the Al layer (the Al layer is typically either partly or completely consumed during the zincate process). A NiP layer is then plated onto the thin Zn layer, e.g. by electroless plating. The NiP layer is then polished and laser textured. Of importance, the thin Zn layer facilitates electroless plating of NiP, and the Al layer facilitates the formation of the Zn layer by the zincate process. (The zincate process does not work on bare glass.) In lieu of Al, other materials which can be subjected to a zincate process, e.g. Mg, can be used.

In one variation of the first embodiment, an adhesion layer is deposited, e.g. by sputtering, on the glass substrate prior to depositing the Al layer. The adhesion layer causes the Al layer to strongly adhere to the substrate. The adhesion layer is typically Cr, Ta, Mo, W, V, Nb or alloys thereof.

In a second embodiment, instead of using a Zn layer formed by the zincate process as the initiation layer, the initiation layer is formed on the substrate (or adhesion layer) by another process, e.g. sputtering or evaporation. The NiP layer is then formed on the substrate by electroless plating. The NiP layer is then polished and laser textured. The advantage of forming the initiation layer in this manner is that it obviates the need for zincate and pretreatment steps. (In conventional production of NiP plated aluminum substrates, prior to NiP plating, the aluminum substrate is etched, subjected to a first zincate step to form a Zn layer, the Zn layer is stripped off, the substrate is subjected to a second zincate step, and the resulting Zn layer is stripped off. The substrate is then subjected to a third zincate step. The etching, first and second zincate steps, and stripping steps are referred to herein as "pretreatment".)

Plating NiP onto a glass substrate and then laser texturing the NiP has numerous advantages. First, it is difficult to laser texture a glass substrate because glass is not very absorptive of laser light. One needs a very powerful laser, e.g. a $CO_2$ laser, to texture uncoated glass. In contrast, it is relatively easy to texture a NiP layer because NiP readily absorbs laser light.

Second, when laser texturing a substrate, it is necessary that the substrate be smooth and polished. It is difficult and expensive to polish a glass substrate because glass is hard and brittle. I have discovered that the process of the first and second embodiments do not require that the glass substrate be polished. Rather, one can simply plate NiP onto a glass substrate and then polish the NiP layer, which is easier and less expensive than polishing the glass substrate.

Third, it is very easy to zone texture a substrate by laser texturing, whereas it is difficult or impractical to zone texture a glass substrate by chemical etching.

Fourth, glass used to manufacture magnetic disks typically has corrosive constituents such as Na. The Na can diffuse out of the substrate and promote corrosion of the magnetic layer. During a process in accordance with my invention, the glass substrate is essentially encapsulated by NiP, and Na and other impurities cannot reach and corrode the magnetic layer.

Fifth, plated glass substrates have better impact resistance than commonly used plated aluminum substrates.

Of importance, most disks are manufactured using an aluminum substrate that is subjected to the zincate process and then plated with NiP. A glass substrate with a thin Zn layer can be processed into a completed magnetic disk without deviating from manufacturing processes already established for conventional aluminum substrate magnetic disks.

In accordance with a third embodiment of my invention, a layer of material is deposited on a glass substrate (e.g. by sputtering, evaporation or other technique) and then the layer of material is laser textured. The layer of material subjected to laser texturing is capable of absorbing light having the wavelength of the laser used during laser texturing. In addition, the layer of material has good impact resistance and hardness. In one embodiment, the layer of material subjected to laser texturing is amorphous, e.g. an alloy comprising at least one of Ni, Pd, Pt, Re and Fe and at least one of Nb, Ta, Zr, Ti, W and V. The layer of material can also be an alloy comprising at least one of Ni, Co, Fe and Mo and at least one of P, B, Se and Sb. In another embodiment, the layer of material is a crystalline material having a high melting point such as a Co or Ni based alloy, or a silicide of Ni, Nb and Pt.

In accordance with one variation of the third embodiment, an adhesion layer such as sputtered Cr is formed between the substrate and the laser textured material.

The third embodiment enjoys many of the same advantages of the first and second embodiments, except that it is preferable that the glass substrate be polished and initially smooth before depositing layers thereon.

The third embodiment has the advantage in that sputtering is a low cost, clean, fast process. In the third embodiment, plating is avoided.

The third embodiment also permits a wider range of laser bump shapes to be provided than can be provided in a layer of plated NiP. For example, one can make "sombrero" bumps over a wider range of laser texturing conditions than the plated NiP.

It is desirable to deposit the layer of material to be laser textured such that it has a smooth surface. However, in one embodiment, this layer has a small amount of roughness to lower stiction and friction in case the read write head inadvertently touches down in the data zone.

A substrate used with a process in accordance with my invention is typically a chemically strengthened glass substrate, such as a borosilicate glass. The glass substrates discussed in the above-incorporated Kijima and Chen patents can be used. Alternatively, other substrate materials such as glass ceramic, SiC, sintered carbon or Si can be used.

DETAILED DESCRIPTION

First Embodiment Using a Plating Process

Figure 1A:
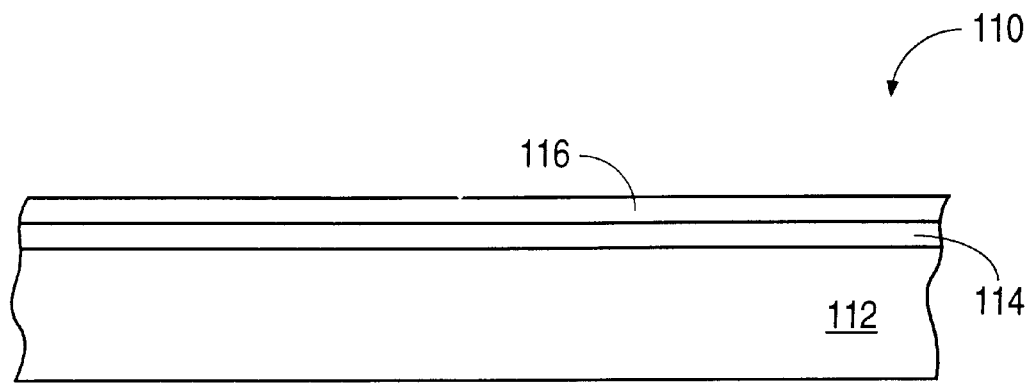
FIGS. 1A and 1B illustrate in cross section a magnetic disk having a glass substrate during a manufacturing process in accordance with a first embodiment of my invention.

Referring to FIG. 1A, a disk 110 includes a glass substrate 112, a Cr adhesion layer 114 and an Al layer 116. Substrate 112 is typically chemically strengthened borosilicate glass. Cr adhesion layer 114 is typically 5 to 50 nm thick (in one embodiment it is 20 nm thick) and is formed by sputtering at a rate of 4 nm/second at a power of 1 kw and a pressure of 6.5 mtorr in argon. In one embodiment, an Intevac 250A sputtering system (manufactured by Intevac of Santa Clara, Calif.) is used to D.C. magnetron sputter layers 114 and 116. Al layer 116 is typically 50 to 500 nm thick (in one embodiment 200 nm thick) and is also formed by sputtering, at a rate of 6.3 nm/second at a power of 1 kw and a pressure of 10 mtorr in argon. Cr layer 114 is optional, and is provided to ensure that subsequently deposited layers strongly adhere to glass substrate 112. Al layer 116 facilitates a subsequent zincate process.

Figure 1B:
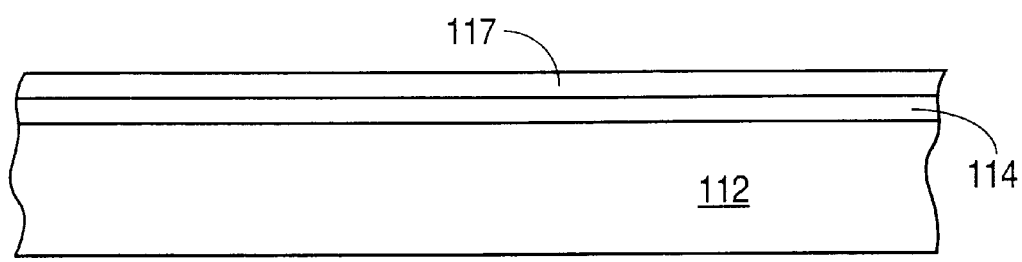

Referring to FIG. 1B, disk 110 is subjected to a zincate process, e.g. as described in the above-incorporated Lowenheim reference, to form a Zn initiation layer 117. Zn initiation layer 117 is typically about 5 to 10 nm thick. During this process, Al layer 116 is partially or completely consumed, depending on its thickness.

In one embodiment, the substrate is subjected to a first zincate process, the resulting Zn layer is stripped off by dilute nitric and sulfuric acids, the substrate is subjected to a second zincate process, the resulting Zn layer is stripped off, and then the substrate is subjected to a third zincate process. These process steps result in formation of an improved NiP film (formed in a subsequent plating process, described below) with a finer NiP nodule structure, and a smoother NiP surface, but it is not presently clear why this is. In other embodiments, the zincate process is only performed twice. In yet other embodiments, the zincate process is only performed once.

Figure 1C:
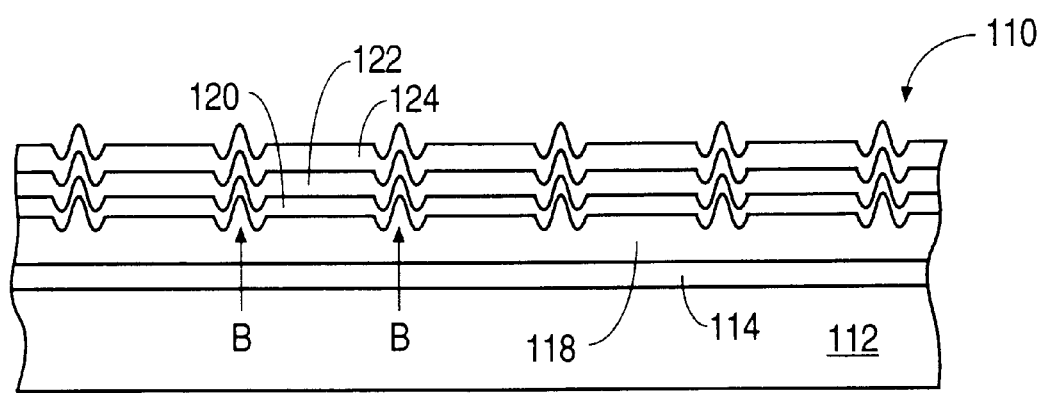
FIG. 1C illustrates in cross section the magnetic disk of FIGS. 1A and 1B at the conclusion of manufacturing.

Referring to FIG. 1C, NiP layer 118 is deposited to a thickness between 5 and 10 microns, and typically about 8 microns, by electroless plating. NiP plating is discussed by Pearlstein, "Electroless Plating", which is chapter 31 of the third edition of "Modern Electroplating", edited by Lowenheim, published by Wiley in 1974, incorporated herein by reference. During NiP plating, Zn layer 117 is consumed. (Of importance, electroless plating of NiP is an autocatalytic process. Zn layer 117 initiates that process.)

NiP layer 118 is then polished using conventional techniques and laser textured to form bumps B. Laser texturing can be accomplished using an yttrium vanadate laser, available from Spectra Physics Corporation. Such a laser typically produces pulses at a frequency of 5 KHz having a duration of about 10 to 70 nanoseconds ("ns"), a spot size of 6 to 11 microns, delivering 0.06 to 3 microjoules per pulse and a wavelength of 1.064 microns. Alternatively, an yttrium lutetium fluoride ("YLF") laser, manufactured by Schwartz Electro Optics Co., with a wave length of 1.047 microns, 0.3 to 15 microjoules per pulse, a spot size of 6 to 11 microns, a pulse rate of 70 KHz, and a pulse duration of 200 to 300 ns can be used. However, other types of lasers can be used to texture a disk in accordance with my invention.

Figure 2A:
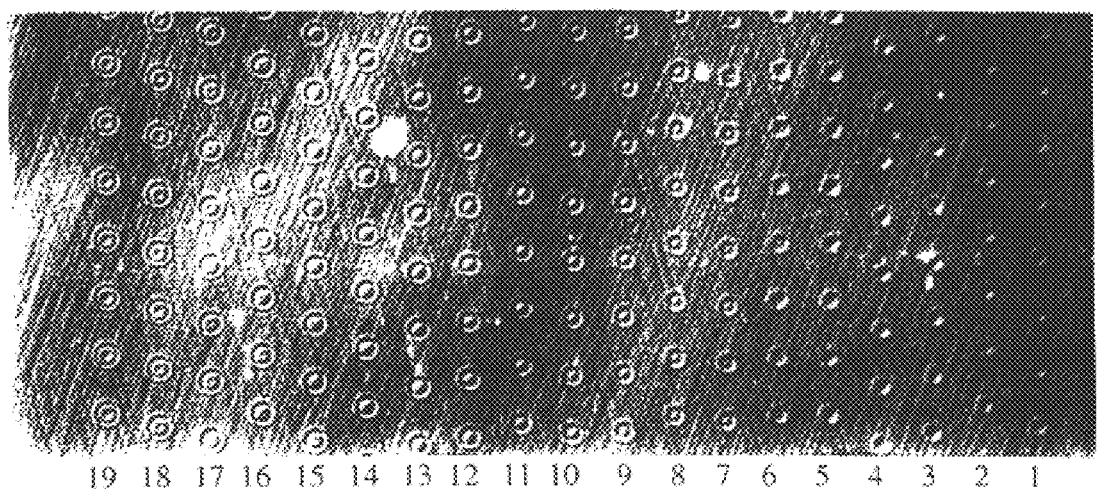
FIGS. 2A and 2B illustrate laser bumps formed in a plated NiP layer in accordance with my invention.

While the laser is pointed at the NiP film, the substrate is rotated, so that each pulse forms a bump at a different position on the disk. The amount of energy delivered during each pulse, the pulse duration and spot size are selected to provide bumps having a desired size and profile. FIG. 2A illustrates a series of laser bumps formed on a plated NiP layer on a glass substrate. The substrate included a 20 nm thick Cr layer and a 200 nm thick Al layer. A sacrificial Zn layer was formed by a zincate process, and the NiP was plated thereon. The laser bumps were formed in a series, each group of bumps in the series labelled from 1 to 19 in FIG. 2A. Laser pulses at 2.86 microjoules of energy were used to form group 1. The spot size was 11 microns, and the laser pulse duration was 25 ns.

The power used to form the bumps in group 2 was 5% greater than the power used to form the bumps in group 1, the power used to form the bumps in group 3 was 5% greater than the power used to form the bumps in group 2, and so forth. As can be seen, one can alter the size and profile of the laser bumps by adjusting the power of the laser beam used to form the bumps. In one embodiment, the energy used to form laser bumps is between 2 and 6 microjoules, the pulse duration is between 14 and 40 ns, and the spot size is between 6 and 11 microns. However, my invention is not limited to the specific parameters used to form bumps, and those skilled in the art will be able to select laser parameters to tailor bump sizes and profiles to suit their requirements.

Figure 2B:
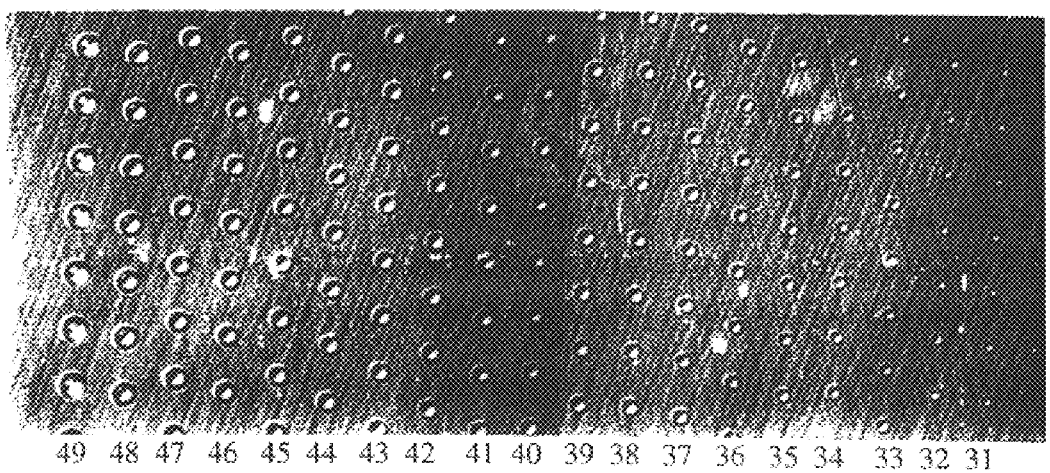
Figure 6:
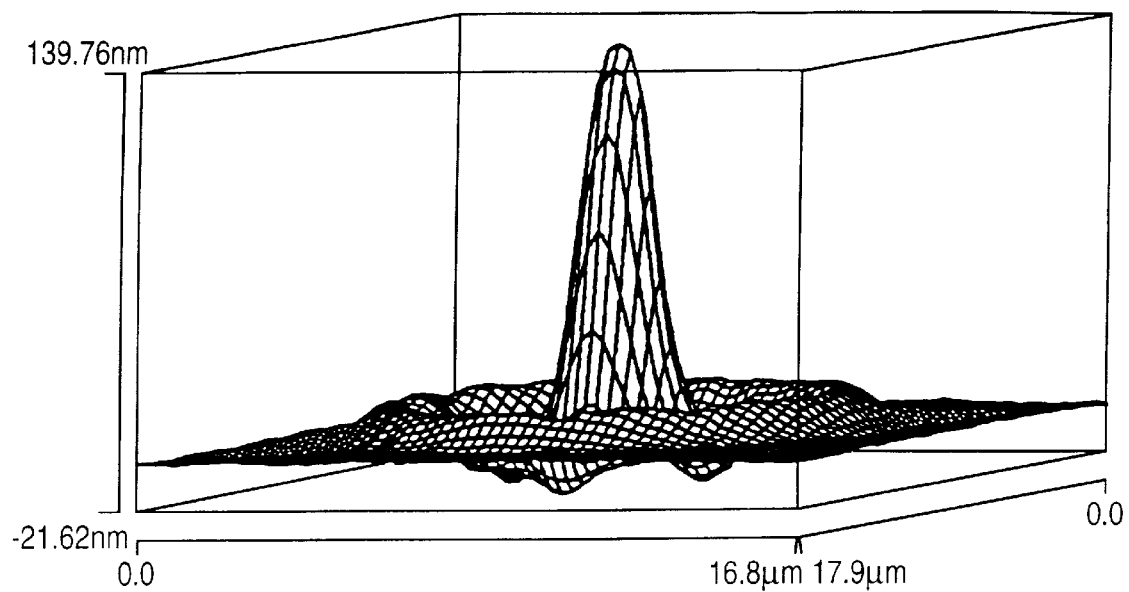
FIG. 6 illustrates a "sombrero" shaped bump formed by a laser in a sputtered NiP layer (15.5 wt. % P).
Figure 7:
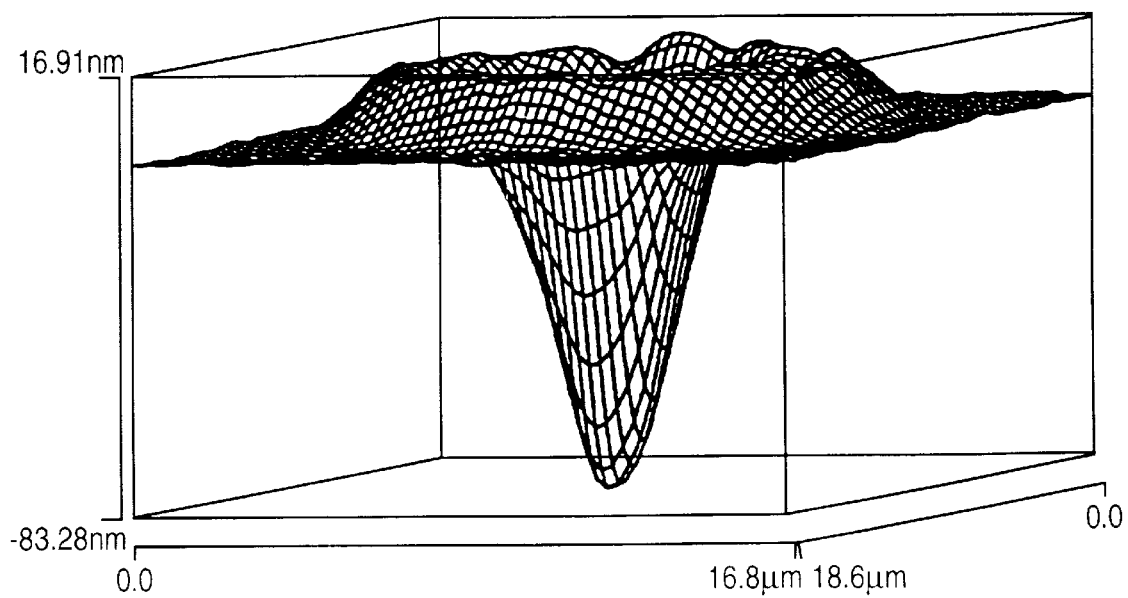
FIG. 7 illustrates a "ridge" shaped bump formed by a laser in a sputtered NiP layer (15.5 wt. % P).

The bump shapes in FIG. 2A are generally "sombrero" shaped. Laser pulses typically form either a sombrero shape (e.g. as shown in FIG. 6) or a ridge shape (FIG. 7). In a plated NiP layer, one can form sombrero shaped bumps, as shown in FIG. 2A and 6, or ridge shaped bumps, as shown in FIG. 2B and 7. (The bumps of FIGS. 6 and 7 were formed in layers of sputtered NiP. Laser texturing of sputtered NiP layers is discussed below.) Sombreros can be formed in plated NiP using short pulses (e.g. less than about 30 ns) combined with wide spot sizes (e.g. greater than about 10 microns). Ridge shapes predominate under other conditions. FIG. 2B shows a set of ridge shaped bumps formed in plated NiP. The NiP was formed on a glass substrate covered with 20 nm thick Cr and 200 nm thick Al. The Al was subjected to a zincate step and electroless plating of NiP. The bumps in FIG. 2B are arranged in rows labelled 31 to 49. The bumps were formed using 40 ns laser pulses and a spot size of 8 microns. The spots in row 31 were formed with pulses of 0.77 microjoules. The pulses in row 32 had 10% more energy than those of row 31, the pulses of row 33 had 10% more energy than those of row 32, and so forth. As can be seen, the FIG. 2B bumps are ridge shaped.

My invention encompasses both ridge and sombrero bumps. In the case of either type of bump, the bump height increases with increased laser power. For either type of bump, the laser power must be sufficient to melt the NiP. The laser power should not be so great as to burn through the NiP.

After texturing, disk 110 is then completed by a conventional process, e.g. sputtering a non-ferromagnetic underlayer such as a NiP or Cr underlayer 120, a magnetic layer 122 and a protective overcoat 124. See, for example, U.S. Pat. No. 5,180,640, issued to Yamashita, incorporated herein by reference.

In one embodiment, underlayer 120 is Cr and magnetic layer 122 is an alloy such as CoCrTa deposited at a relatively high sputtering rate (e.g. about 10 nm/second). The substrate is heated to about 200° C. during sputtering. Cr underlayer 120 is used to control the magnetization direction of magnetic layer 122.

The present invention can also be used in a sputtering process in which the substrate is not heated. In one example of such a process, underlayer 120 includes a mixture of NiP and about 2% $Al_2O_3$, and magnetic layer 122 comprises CoNiPtTiTa and a small amount of $SiO_2$, sputtered at a relatively slow rate (e.g. less than 0.5 nm/second). (See, for example, U.S. patent application Ser. No. 08/286,653, now U.S. Pat. No. 5,658,659 which issued on Aug. 19, 1997, filed by Chen, et al., assigned to Komag, Inc., incorporated herein by reference.) However, my invention is not limited to the specific materials used in the underlayer or magnetic layer, nor is my invention limited to the specific deposition methods or conditions.

For example, in lieu of sputtered NiP, other sputtered underlayer materials can be used, e.g. as described in U.S. Pat. No. 4,786,564, incorporated herein by reference.

In lieu of Cr as adhesion layer 114, other materials can be used, e.g. Ta, Mo, W, V or Nb, or alloys thereof. Alternatively, adhesion layer 114 can be omitted.

In lieu of Al layer 116, other materials that can be subjected to a zincate process can be used, e.g. Mg or alloys of Al or Mg.

In lieu of plated NiP, other materials can be plated onto the substrate for laser texturing, e.g. CoP or FeP.

In lieu of borosilicate glass, other glass compositions or materials such as silicon, SiC, ceramic, glass ceramic, or sintered carbon can be used as substrate 112.

Second Embodiment Using a Plating Process

Figure 3:
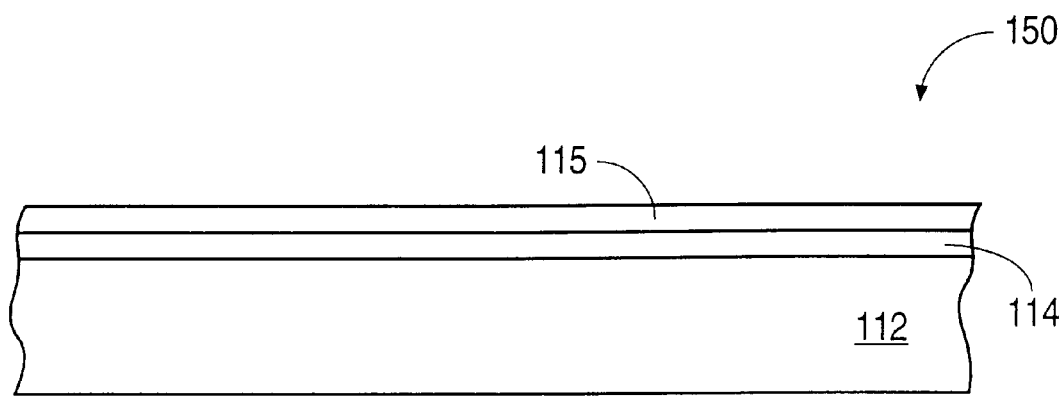
FIG. 3 illustrates in cross section a magnetic disk having a glass substrate during a manufacturing process in accordance with a second embodiment of my invention.

FIG. 3 illustrates a magnetic disk 150 during a manufacturing process in accordance with a second embodiment of my invention, including glass substrate 112 and optional Cr adhesion layer 114 as discussed above. However, in the embodiment of FIG. 3, a Zn initiation layer 115 is formed by a vacuum deposition process such as sputtering. When formed by sputtering, Zn layer 115 can be sputtered at a rate of 24 nm/second at a power of 1 kw and a pressure of 10 mtorr in argon. Zn layer 115 is typically 60 nm thick.

Thereafter, NiP layer 118 is electroless plated onto Zn initiation layer 115, and is then polished and laser textured. (Zn layer 115 is either partially or completely consumed during NiP plating.) Manufacture of the disk is then completed by deposition of underlayer 120, magnetic layer 122 and protective overcoat 124 as discussed above in relation to Fig 1C.

In lieu of Zn, other materials capable of initiating electroless plating can be used, e.g. Pd, Co, Fe, Rh, Be, NiP, Ni and alloys thereof. Such materials can be vacuum-deposited (e.g., by sputtering) either onto adhesion layer 114, or directly onto substrate 112.

Third Embodiment Using a Vacuum Deposited Texture Layer

Figure 4:
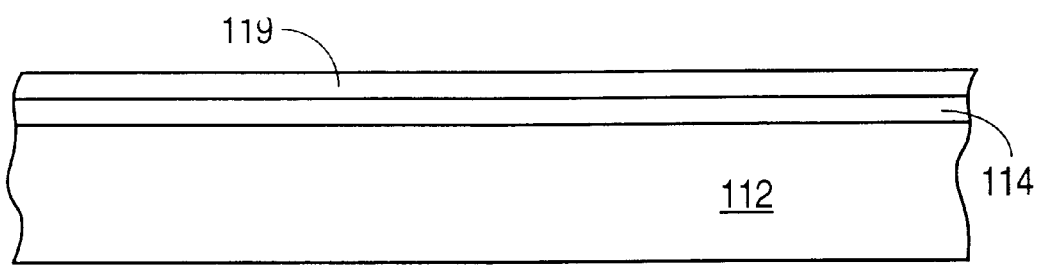
FIG. 4 illustrates in cross section a magnetic disk having a glass substrate constructed in accordance with a third embodiment of my invention.

Referring to FIG. 4, in another embodiment of my invention, instead of using electroless plated NiP, a NiNb layer 119 (e.g. 50% Ni, 50% Nb by mole) is vacuum-deposited onto adhesion layer 114, e.g. to a thickness of 50 to 500 nm. In one embodiment, NiNb is deposited by sputtering. NiNb is amorphous and does not tend to crystalize. I have discovered that texture bumps can be formed in NiNb having a height of 20 to 30 nm. Even for NiNb films 100 nm thick, I have found that texture bumps of 20 to 25 nm can be formed.

In one embodiment, laser texturing is accomplished using a vanadate laser, a laser pulse duration of 14 to 260 ns, an energy per pulse of 0.1 to 10 microjoules, and a spot size of 6 to 11 microns.

Figure 5:
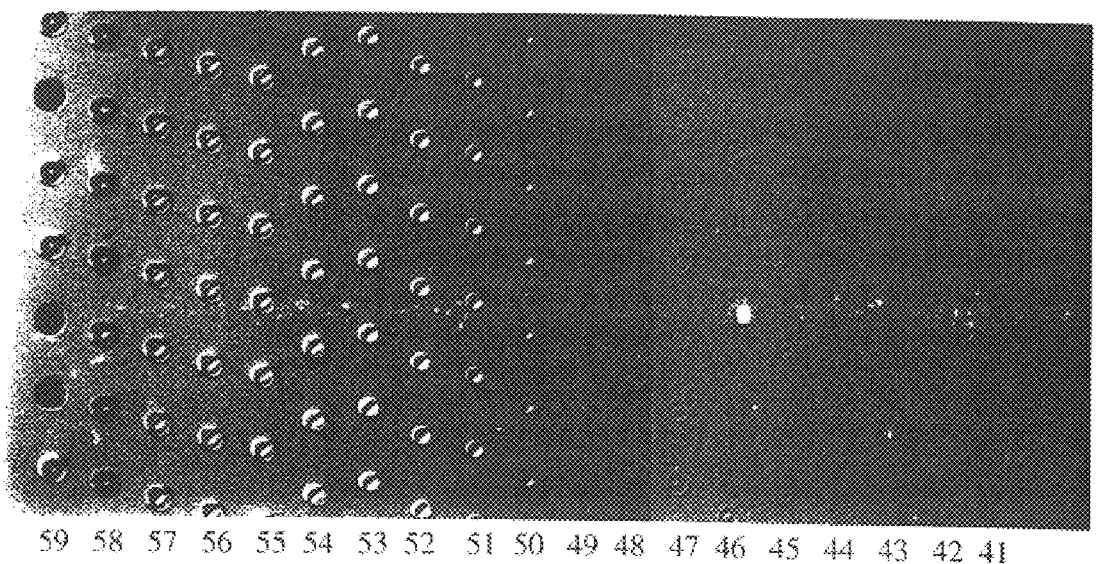
FIG. 5 illustrates laser bumps formed in a NiNb layer formed on a glass substrate in accordance with my invention.

FIG. 5 illustrates a series of laser bumps labelled 41 to 59 formed in a 500 nm thick sputtered NiNb film in accordance with my invention. The laser was the same as that used to form the bumps in FIGS. 2A and 2B. The substrate included a 25 nm thick Cr layer. The energy used to form the bumps in group 41 was 1.44 microjoules, with each succeeding group of bumps formed with 10% more energy.

I have found that NiNb forms sombrero bumps for pulse durations of 14 to 270 ns and spot sizes of 6 to 11 microns. The height of the sombrero bumps increases with laser power.

Figure 8:
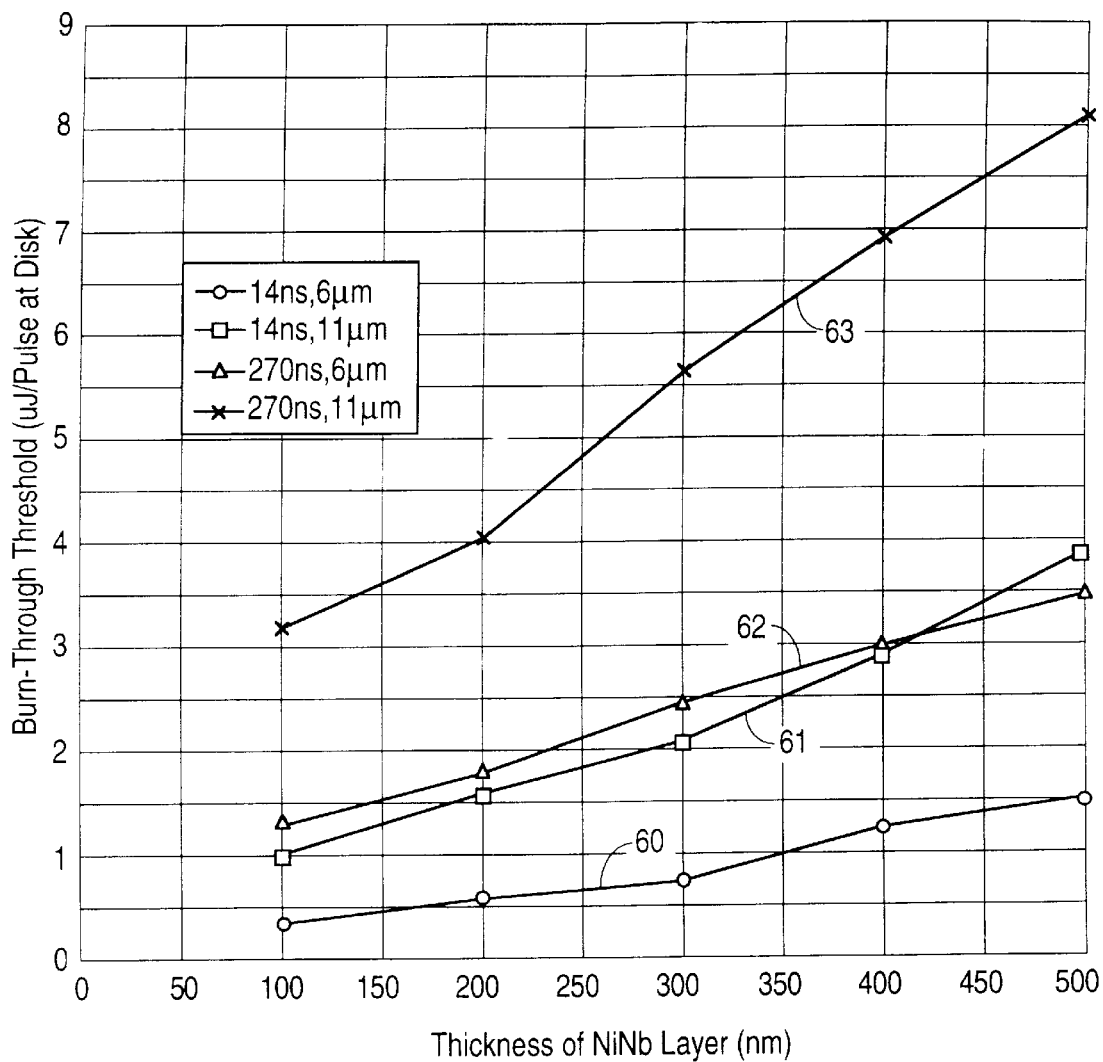
FIG. 8 illustrates the relationship between the thickness of a NiNb layer and the energy required to burn through the NiNb layer.

Once again, it is seen that the size and profile of the laser bumps can be selected by adjusting the laser pulse parameters such as power. One skilled in the art, in light of this specification, can select those parameters which will produce texture bumps as required. However, laser power should not be so great as to burn through the NiNb layer. FIG. 8 shows the relationship between NiNb layer thickness (the X axis of FIG. 10) and the amount of energy per pulse required to burn through a NiNb layer (the Y axis of FIG. 10).

In FIG. 8, the NiNb layer was sputtered onto a 25 nm Cr layer formed on a glass substrate. The spot size and pulse duration of the laser pulse used to collect the data of FIG. 8 were as follows:

| Curve in FIG. 8 | Pulse Duration | Spot Size |
| --- | --- | --- |
| 60 | 14 ns | 6 microns |
| 61 | 14 ns | 11 microns |
| 62 | 270 ns | 6 microns |
| 63 | 270 ns | 11 microns |

As can be seen, the thicker the layer being textured, the greater the energy needed to burn therethrough.

After texturing, the disk is completed by forming underlayer 120, magnetic layer 122 and protective overcoat 124 as discussed above.

In another embodiment, NiNb is sputtered directly onto substrate 112.

In lieu of NiNb, other materials can be used, e.g. alloys having a first constituent comprising one of Ni, Pd, Pt, Re and Fe and a second constituent comprising one of Nb, Ta, Zr, Ti, W and V. Such a material should be hard and have good impact resistance. When sputtered, these materials tend to deposit in amorphous form.

In another embodiment, an alloy having a first constituent comprising one of Ni, Co, Fe and Mo and a second constituent comprising one of P, B, Se and Sb can be used. Such alloys are also sputter deposited in amorphous form.

In another embodiment, a crystalline film having a high melting point can be used, e.g. Co and Ni based alloys. Silicides such as suicides of Ni, Nb and Pt can be used.

Preferably, a texture layer (such as NiNb or the materials listed above) in accordance with this embodiment has a thickness between 10 and 1000 nm. Thinner layers are preferable for economic reasons. Sputtering can be by DC magnetron, RF or RF magnetron sputtering at high rates (e.g. 2 to 20 nm/seconds) and low pressures (1 to 20 mtorr). The texture layer should be smooth prior to laser texturing. This is important because texturing is typically only performed in the CSS zone, and the data zone of the disk should remain smooth.

OTHER EXAMPLES

Example 1

Substrates were prepared by depositing 20 nm thick Cr on a borosilicate glass substrate. An amorphous NiP layer having a thicknesses of 1 micron was sputtered onto the Cr layer, and laser textured. The laser energy was between 0.1 and 2.63 microjoules per pulse, each pulse lasting 14 ns. The spot size was 11 microns.

FIG. 6 shows a sombrero bump formed in a 1 micron thick layer of NiP (15.5 wt. % P) sputtered onto a 80 nm Cr layer, which was sputtered onto a glass substrate. The pulse duration was 14 ns, and the spot size was 11 microns. The pulse energy was 0.59 microjoules.

FIG. 7 shows a ridge bump, also formed in a layer of 1 micron thick NiP (15.5 wt. % P) sputtered onto 80 nm Cr, which was sputtered onto a glass substrate. The pulse duration was 14 ns and the spot size was 11 microns. The pulse energy was 0.94 microjoules. It is thus seen that for the case of a 14 ns pulse duration and an 11 micron spot size, one can form either ridge or sombrero bumps in sputtered NiP, depending on the laser pulse energy.

Example 2

A substrate was prepared by depositing 20 nm thick Cr as a borosilicate glass substrate. Amorphous NiNb layers having thicknesses of 100 nm, 500 nm and 1 micron were sputtered on the Cr layer and laser textured. The NiNb was 50% Ni by mole. Laser pulses of 0.5 to 13 microjoules, 25 to 264 ns in duration, and spot sizes of 6 to 11 microns were used. Sombrero shaped bumps were formed under all conditions, but size and height increased with power. By reducing film thickness, one could use less power to make bumps of a given size. If laser power was too great, the laser would burn through the NiNb film. The thinner the film, the less energy was needed to burn through the NiNb. Also, the smaller the spot size, the less energy was needed to burn through the NiNb. However, this is not a problem, because texture bumps having heights between 0 and 100 nm can be formed using laser power that was not so great as to burn through the NiNb.

Example 3

A substrate was prepared by depositing 20 nm thick Cr on a borosilicate substrate. Crystalline NiAl layers having thicknesses of 100 nm, 500 nm and 1 micron were sputtered on the Cr layer and laser textured. The NiAl was a 50% Ni by mole. Laser pulse energy of 0.93 to 6.3 microjoules, a pulse duration of 25 ns and a 10 micron spot size were used. Sombrero bumps tended to form in NiAl films having thicknesses of 100 nm and 500 nm. Ridge bumps tended to form in the 1 micron thick NiAl film.

NiAl films cracked for laser powers above 1.0, 3.6 and 4.0 microjoules for NiAl thicknesses of 100, 500 and 1000 nm, respectively (for pulses of 25 ns duration and a 10 micron spot size). Cracking is undesirable, and is believed to be due to film stress. It is further believed that film stress (and therefore cracking) can be avoided by adjusting sputter conditions of the NiAl.

Bump Height Variation as a Function of Laser Energy

Figure 9:
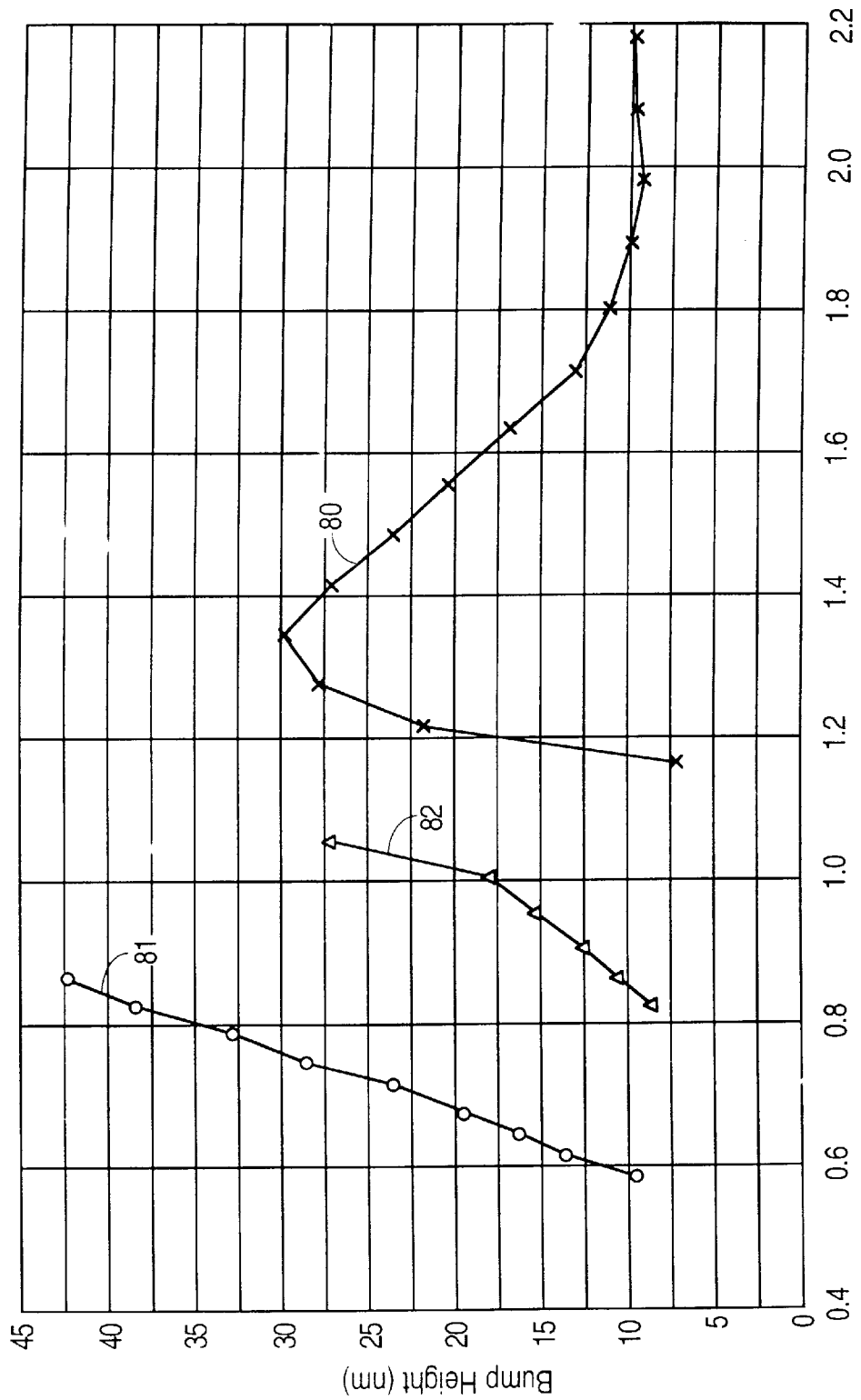
FIG. 9 illustrates the relationship between bump height and laser pulse energy for various texture layer materials.

As mentioned above, bump heights increase with increases in laser energy. It is generally desirable that for the material and laser parameters being used, the bump height not vary by more than 1 nm per 1% fluctuation in laser power. This is because laser power for typical lasers fluctuates during use, and it is desirable to minimize the resulting bump height variation. FIG. 9 illustrates the relationship between bump height and laser pulse energy for NiP-plated Al (curve 80), 100 nm thick NiNb sputtered onto 25 nm thick Cr sputtered onto glass (curve 81), and 100 nm thick CoNiPtTaTiSiO$_2$ sputtered onto 25 nm thick Cr sputtered onto glass (curve 82). (CoNiPtTaTiSiO$_2$ is a magnetic alloy, and would generally be undesirable as a texture layer for that reason.) The pulse width was 14 ns and the spot was 11 μm. The Y axis of FIG. 9 is in nanometers, while the X axis represents laser pulse energy in microjoules. In curve 81, the slope is generally less than 1 nm per 1% change in pulse energy. In curve 82, for pulses less than 1 microjoule, the slope is also less than 1 nm per 1% change in pulse energy for curve 80, operating near the top of curve 80 provides the benefit of near insensitivity to laser pulse energy fluctuations. (Operating near the top of curve 80 also prevents the bump heights from being chosen arbitrarily as it can be in curves 81 and 82). The bumps in FIG. 9 had the following shapes:

80 sombreros
81 ridges
82 sombreros

Impact Resistance

Figure 10:
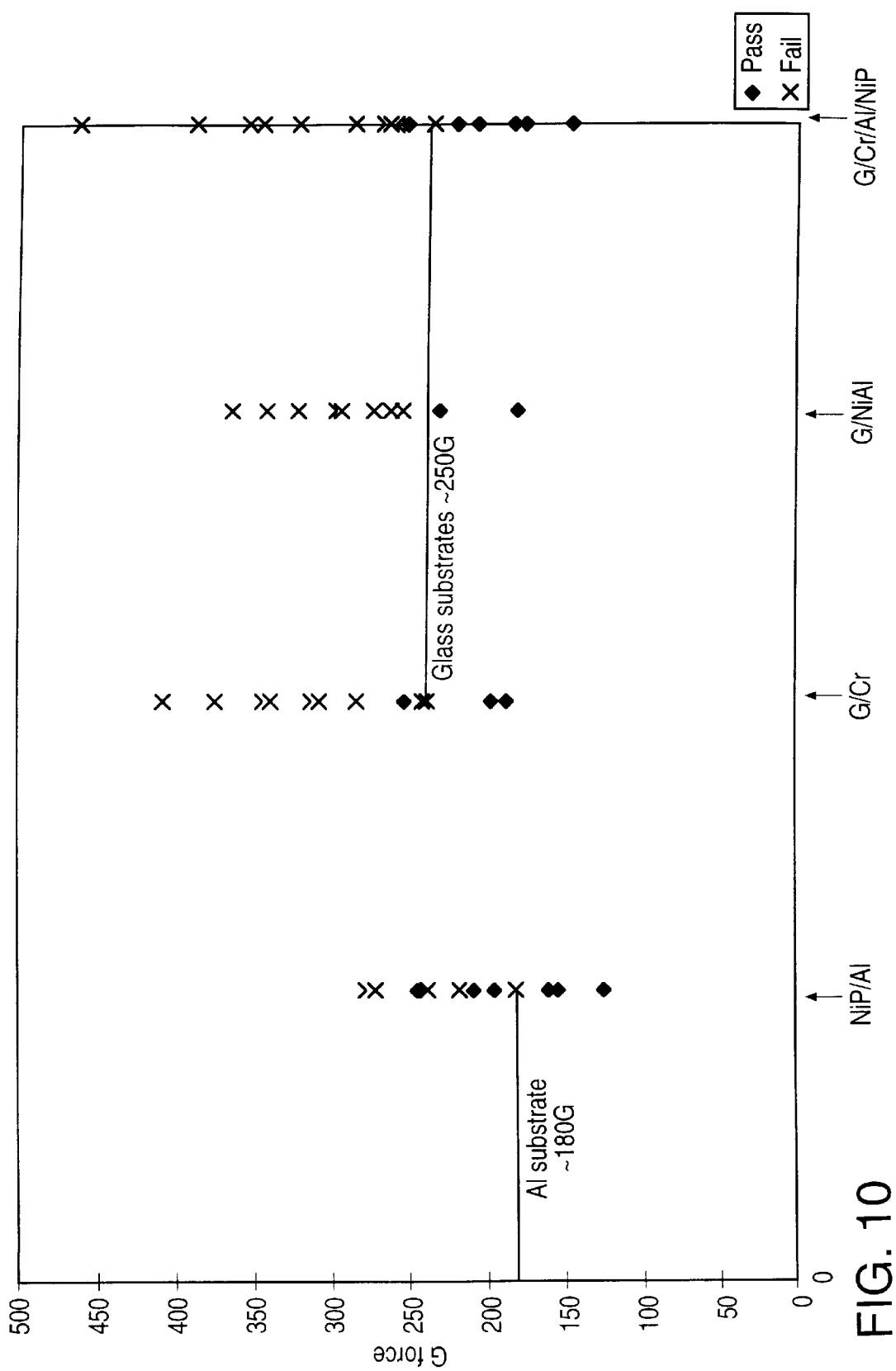
FIG. 10 compares the impact resistance of disks comprising Al substrates covered with plated NiP and disks comprising glass substrates.

As demonstrated above, a laser can be used to texture a metallic film on a glass substrate. One advantage of this method is that glass substrates exhibit greater impact resistance than NiP-plated aluminum. FIG. 10 shows the force needed to dent substrates having the following structures:

1. An aluminum substrate plated with 8 micron thick NiP (labelled "NiP/Al" in FIG. 10);
2. Glass covered with 20 nm thick Cr (labelled "G/Cr" in FIG. 10);
3. Glass covered with 1 micron thick NiAl (labelled "G/NiAl" in FIG. 10); and
4. Glass covered with 20 nm thick Cr, 200 nm thick Al (subjected to a zincate process), and 8 nm thick NiP (labelled "G/Cr/Al/NiP" in FIG. 10).

During the test corresponding to FIG. 10, a disk with a 50% slider resting thereon was accelerated and then suddenly stopped. (The term "50% slider" is well known in the art, and refers to the size of the slider.) Since the disk rapidly decelerated, the slider resting on the disk was rapidly decelerated by the force exerted by the disk surface against the slider. This force was measured in "G's", and is set forth on the Y axis of FIG. 10. (1 G is the force that decelerates an object 9.8 meters per second squared, i.e. the force of gravity.) This test can be used to simulate the force exerted on a disk and slider if one inadvertently drops a disk drive on the floor. The X's in FIG. 10 indicate those test trials which resulted in unacceptable dents in the disk surface. The diamond marks indicate those test trials which did not result in unacceptable dents in the disk surface.

As can be seen, it took 180 G's to dent the NiP-plated aluminum substrate, and about 250 G's to dent the glass substrates. Thus, glass substrates are more impact resistant than NiP-plated Al.

While the invention has been described with respect to specific embodiments, those skilled in the art will recognize that changes can be made in form and detail without departing from the spirit and scope of the invention. For example, the present invention can be used in accordance with non-metallic substrates or non-conductive substrates other than glass. See, for example, Perettie, "Alternative Substrates: The Critical Issues", IDEMA Insight, November/December 1995, incorporated herein by reference. In addition, the various layers on the disk can be formed by any of several methods, e.g. sputtering, evaporation, etc. The invention is not limited by deposition parameters, such as pressures and deposition rates. The invention can be used to zone texture a magnetic disk, or to texture the entire surface of a magnetic disk. In the alternative, the invention can be used to form a rough texture having large bumps in CSS zone and a smoother texture having small bumps in a data zone. Although the invention can be practiced with metallic texture layers having a high melting point, the present invention can be practiced with other laser texture layer materials such as Al or Cu. Accordingly, all such changes come within the present invention.

What is claimed is:

1. A method of making a magnetic disk comprising the steps of:

depositing a metallic initiation layer on an unpolished glass ceramic substrate;

electroless plating a texture layer on said metallic initiation layer, said initiation layer initiating electroless plating of said texture layer onto said substrate;

polishing said texture layer;

laser texturing said texture layer; and depositing a magnetic layer on said texture layer.

2. Method of claim 1 wherein said texture layer is metallic.

3. Method of claim 1 wherein said initiation layer comprises a material selected from the group consisting of Zn, Pd, Co, Fe, Rh, Be, NiP and Ni.

4. Method of claim 3 wherein said initiation layer is an alloy of at least one material selected from the group consisting of Zn, Pd, Co, Fe, Rh, Be, NiP and Ni.

5. Method of claim 1 wherein said initiation layer is formed by vacuum deposition.

6. Method of claim 5 wherein said initiation layer is formed by sputtering.

7. Method of claim 1 wherein said initiation layer comprises Zn, and said step of depositing said initiation layer comprises the steps of:

depositing a metallic layer on said substrate; and subjecting said substrate to a zincate process, whereby said metallic layer is at least partially consumed.

8. Method of claim 7 wherein said metallic layer comprises a material selected from the group consisting of Al, Mg, Al alloys and Mg alloys.

9. Method of claim 1 further comprising the step of forming an adhesion layer between said substrate and said initiation layer.

10. Method of claim 9 wherein said adhesion layer comprises a material selected from the group consisting of Cr, Ta, Mo, W, V or Nb.

11. Method of claim 1 wherein said initiation layer is formed by vacuum deposition.

12. Method of claim 1 wherein said texture layer comprises a material selected from the group consisting of CoP, FeP and NiP.

13. Method of claim 1 further comprising the step of polishing said texture layer prior to laser texturing said texture layer.

14. Method of claim 1 further comprising the step of forming an underlayer on said texture layer after said step of laser texturing said texture layer and before said step of depositing said magnetic layer.

15. A method for manufacturing a magnetic disk comprising the steps of:

depositing a metallic initiation layer onto a glass ceramic substrate;

electroless plating a NiP layer onto said substrate after said step of depositing said metallic initiation layer, said initiation layer initiating said electroless plating of NiP;

laser texturing said NiP layer; and depositing a magnetic layer onto said NiP layer after said step of laser texturing.

16. Method of claim 15 further comprising the step of forming an adhesion layer between said substrate and initiation layer, said adhesion layer comprising a material selected from the group of materials consisting of Cr, Ta, Mo, W, V and Nb, said method further comprising the step of depositing an underlayer between said NiP layer and said magnetic layer, said underlayer comprising a sputtered material selected from the group consisting of NiP and Cr.

17. Method of making a magnetic disk comprising the steps of:

depositing an initiation layer on an unpolished glass ceramic substrate; electroless plating a plated layer on said initiation layer, said initiation layer initiating electroless plating of said plated layer on said substrate;

polishing said plated layer;

texturing said plated layer; and then depositing an underlayer and a magnetic layer onto said plated layer.

18. Method of claim 17 wherein said plated layer is between 5 and 10 microns thick.

19. A method for making a magnetic disk comprising the steps of:

depositing a texture layer on a glass ceramic substrate, said texture layer comprising a nickel-niobium alloy;

laser texturing said texture layer; and depositing a magnetic layer on said texture layer.

20. Method of claim 19 wherein said texture layer is metallic.

21. Method of claim 19 further comprising the step of forming an adhesion layer between said substrate and said texture layer.

22. Method of claim 19 wherein said texture layer is formed by vacuum deposition.

23. The magnetic disk manufactured by the method of claim 19.

24. Method of claim 19 wherein said magnetic layer is isotropic in the plane of the magnetic film.

* * * * *